United States Patent [19]

Kaji et al.

[11] Patent Number: 5,034,429
[45] Date of Patent: Jul. 23, 1991

[54] PHOTOPOLYMERIZABLE COMPOSITION

[75] Inventors: Makoto Kaji; Nobuyuki Hayashi; Futami Kaneko, all of Hitachi, Japan

[73] Assignee: Hitachi Chemical Co., Ltd., Tokyo, Japan

[21] Appl. No.: 201,444

[22] Filed: Jun. 2, 1988

[30] Foreign Application Priority Data

Jun. 3, 1987 [JP] Japan .................................. 62-139354
Jun. 8, 1987 [JP] Japan .................................. 62-142913

[51] Int. Cl.$^5$ ............................................. C08L 67/00
[52] U.S. Cl. ........................................ 522/12; 522/14; 522/16; 525/21; 525/24; 525/25; 525/26
[58] Field of Search .............................. 522/12, 14, 16

[56] References Cited

U.S. PATENT DOCUMENTS 4,278,751  7/1981  Specht et al. .......................... 522/16
4,543,318  9/1985  Maeda et al. ......................... 430/288
4,707,431 11/1987  Umehara ............................... 522/14

Primary Examiner—Roland Martin
Assistant Examiner—Susan Berman
Attorney, Agent, or Firm—Antonelli, Terry, Stout & Kraus

[57] ABSTRACT

A photopolymerizable composition comprising (a) an addition polymerizable compound having a boiling point of 100° C. or high under an atmospheric pressure, (b) a photoinitiator, and (c) a benzene derivative can provide a cured film having high strength suitable for producing, e.g. printed circuit boards.

10 Claims, No Drawings

PHOTOPOLYMERIZABLE COMPOSITION

BACKGROUND OF THE INVENTION

The present invention relates to a photopolymerizable composition, and more particularly to a photopolymerizable composition improved in the strength of cured film obtained therefrom.

In the manufacture of printed circuit boards, dry film type photoresist is superior to liquid type resist in that the former can easily be formed into a ohotoresist layer having a uniform film thickness, it can be applied to the so-called tenting process as a through-hole etching resist, etc. According to the tenting process, holes called "through-hole" are previously perforated, a metallic layer of copper or the like is formed in the through-hole, a dry film is laminated on both sides of a two-sided substrate having conductive layers on its both sides, it is exposed to light pattern-wise so as to form a resist film a little greater than the through-hole diameter on the necessary circuit pattern and through-holes, it is developed, and thereafter it is etched to remove the unnecessary metal layer. At the time of etching, the metal inside the through-holes is protected by the resist film provided on the through-holes, so that both sides of the printed circuit board thus formed are brought into an electrical continuity. Although the dry film resist used for this purpose is required to be tightly adhesive to substrate stably under the conditions of development and etching and to be prevented from penetration of etching solution into through-holes, no satisfactory dry film resist has hitherto been obtained from the viewpoint of general performances. Although an increased quantity of light exposure at the time of pattern formation generally brings about an improvement in tent film strength, an increase in the quantity of light exposure is accompanied by a decrease in the degree of resolving power which makes it difficult to form a high density pattern and further it prolongs the time period necessary for exposure which decreases the productivity.

Although methods for improving the adhesion to substrate in the land parts around through-holes and thereby enhancing reliability were proposed in Japanese Patent Application Kokai (Laid-Open) Nos. 59-113,432, 60-12,543, 59-166,944 and 60-19,135, these methods comprise adding a substance accelerating adhesion into the photosensitive layer, which often causes various failures in the succeeding process such as failure of development, tailing of resist, and the like.

With the aim of improving the strength of cured photosensitive film after exposure, addition of halogen type additive was proposed in Japanese Patent Application Kokai (Laid-Open) Nos. 60-15,972, 57-60 327 and 59-78,339, and the method is useful for improving sensitivity and color-developing performance, too. However, this method is disadvantageous in that it causes a decrease in storage stability in photoresists having a relatively high sensitivity. Particularly when the photosensitive layer is contacted with copper surface, this method tends to promote the dark reaction in unexposed areas.

SUMMARY OF THE INVENTION

The present invention solves the above-mentioned problems of prior art and provides a photopolymerizable composition capable of giving a cured film having high strength.

The present invention provides a photopolymerizable composition comprising:

(a) at least one addition-polymerizable compound having a boiling point of 100° C. or higher at atmospheric pressure,
(b) a photoinitiator, and
(c) a benzene derivative represented by the formula:

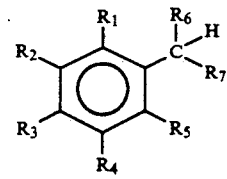

[I]

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an amino group, an acyl group having 1 to 12 carbon atoms, a formyl group, a hydroxyl group or a carboxyl group; $R_6$ is a hydrogen atom, a halogen atom, an alkyl group having 1 to 12 carbon atoms, an alkoxy group having 1 to 12 carbon atoms, an acyl group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl group, an arylcarbonyl group or an arylcarbonyloxy group; and $R_7$ is an alkyl group having 1 to 12 carbon atoms, a hydroxyl group, a formyl group, a carboxyl group, an alkoxycarbonyl group having 1 to 12 carbon atoms, an alkoxy group having 1 to 12 carbon atoms, an acyl group having 1 to 12 carbon atoms, an alkylcarbonyloxy group having 1 to 12 carbon atoms, an aryl group, an aryl group substituted with a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an amino group, an acyl group having 1 to 12 carbon atoms, a formyl group, a hydroxyl group or a carboxyl group; an aryloxy group, an aryloxycarbonyl group, an arylcarbonyl group or an arylcarbonyloxy group, and/or a benzene derivative represented by the formula:

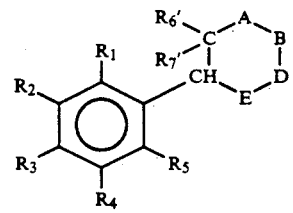

[II]

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbon atoms, an aralkyl group having 7 to 20 carbon atoms, an alkoxycarbonyl group having 1 to 12 carbon atoms, an aryl group, an aryloxy group, an acyl group having 1 to 12 atoms or a carboxyl group; $R_6'$ and $R_7'$ are independently a hydrogen atom, a halogen atom, an alkyl group having 1 to 6 carbon atoms or an aralkyl group having 7 to 20 carbon atoms; and A, B, D and E are independently —CO—, —O—, —S—,

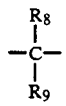

($R_8$ and $R_9$ are independently a hydrogen atom, a halogen atom or an alkyl group having 1 to 6 carbon atoms) or

($R_{10}$ is a hydrogen atom, an alkyl group having 1 to 6 carbon atoms or an acyl group having 1 to 6 carbon atoms).

DESCRIPTION OF THE PREFERRED EMBODIMENTS

As the addition-polymerizable compound (a) contained in the photopolymerizable composition, those having pressure are used. Those having a boiling point lower than 100° C. at ordinary pressure are undesirable from the viewpoint of characteristic properties and workability because such addition polymerizable compounds can be lost by vaporization when the solvent present in system is removed by drying or when the composition is exposed to active rays. Further, it is preferable to use an addition-polymerizable compound soluble into the organic solvent used in the invention, from the viewpoint of giving a uniform composition containing photoinitiator.

Examples of the organic solvent usable include acetone, methyl ethyl ketone, toluene, chloroform, methanol, ethanol, 1,1,1-trichloroethane and the like.

As the addition-polymerizable compound having a boiling point of 100° C. or above at ordinary pressure, those prepared by condensing a polyhydric alcohol with α,β-unsaturated carboxylic acid such as diethylene glycol di(meth)acrylate (the term "di(meth)acrylate" means "diacrylate or dimethacrylate", hereinafter the same), triethylene glycol di(meth)acrylate, tetraethylene glycol di(meth)acrylate, trimethylolpropane di(meth)acrylate, trimethyolpropane tri(meth)acrylate, 1,3-propanediol di(meth)acrylate, 1,3-butanediol (meth)acrylate, pentaerythritol tetra(meth)acrylate, dipentaerythritol hexa(meth)acrylate, dipentaerythritol penta(meth)acrylate, 2,2-bis(4-acryloxydiethoxyphenyl)propane, 2,2-bis(4-methacryloxypentaethoxyphenyl)propane and the like, those prepared by adding α,β-unsaturated carboxylic acid to a glycidyl group-containing compound such as BPE-500 (trade name, manufactured by Shin'nakamura Kagaku K.K., a mixture of 2,2-(bis(4-methacryloxypolyethoxyphenyl)-propanes), trimethylolpropane triglycidyl ether tri(meth)acrylate, Bisphenol A diglycidyl ether di(meth)acrylate, MECHPP (trade name, manufactured by Osaka Yuki Kagaku K.K., γ-chloro-β-hydroxypropyl-β'-methacryloyloxyethyl o-phthalate) and the like; unsaturated amides such as methylenebis-acrylamide, ethylenebis-acrylamide, 1,6-hexamethylenebis-acrylamide and the like; and vinyl esters such as divinyl succinate, divinyl adipate, divinyl phthalate, divinyl terephthalate, divinylbenzene-1,3-disulfonate, etc.; urethane acrylates such as 2,2,4-trimethylhexamethylene diisocyanate, an adduct of cyclohexane dimethanol and β-hydroxyacrylate, etc.

The above-mentioned addition-polymerizable compounds may be used either alone or in combination of two or more.

As the photoinitiator (b) of the invention, hitherto known ones can be used. Examples of the photoinitiator (b) usable in the invention include the various compounds mentioned in Chapter 1 of "UV Curing: Science and Technology" (edited by S.P. Pappas) and Chapter 1 of "UV Curing: Science and Technology, Vol. II" (edited by S.P. Pappas). More concretely saying, they are benzophenone, thioxanthone, chlorothioxanthone, alkyl-substituted thioxanthones, benzil, 4,4'-dimethoxybenzil, 9,10-phenanthrenequinone, 9,10-anthraquinone, azo compounds and acyl phosphines, for example. Binary initiators prepared by combining a reductant such as amine and the like with a benzophenone compound, a thioxanthone compound or a 3-ketocoumarin compound are also usable successfully. Their examples include the following combinations: benzophenone and triethanolamine, benzophenone and Michler's ketone, benzophenone and 4,4'-bis(diethylamino)-benzophenone, 2,4-diethylthioxanthone and isopentyl 4-dimethylaminobenzoate, 2,4-diethylthioxanthone and ethyl 4-dimethylaminobenzoate, 3,3'-carbonylbis(7-diethylamino)coumarin and N,N-diethylaniline, 3-benzoyl-7-methoxy-coumarin and N-phenylglycine, 4'-cyanobenzoyl-5,7-dimethoxycoumarin and N-phenylglycine, and the like. Furhter, as a reductive dyestuff, Rose Bengale, erythrosine, Eosine, riboflavin, Thionine and the like are also usable either alone or in combination with various other reductants. As the photoinitiator, two or more initiators may also be used in combination.

Further, in the invention, a benzene derivative represented by formula [I] and/or formula [II] is used as the component (c).

Benzene derivative of the formula:

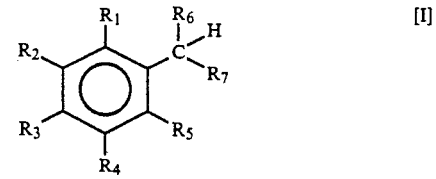

[I]

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an amino group, an acyl group having 1 to 12 carbon atoms a formyl group, a hydroxyl group or a carboxyl group; $R_6$ is a hydrogen atom, a halogen atom, an alkyl group having 1 to 12 carbon atoms, an alkoxy group having 1 to 12 carbon atoms, an acyl group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl group, an arylcarbonyl group or an arylcarbonyloxy group; and $R_7$ is an alkyl group having 1 to 12 carbon atoms, a hydroxyl group, a formyl group, a carboxyl group, an alkoxycarbonyl group having 1 to 12 carbon atoms, an alkoxy group having 1 to 12 carbon atoms, an acyl group having 1 to 12 carbon atoms, an alkylcarbonyloxy group having 1 to 12 carbon atoms, an aryl group, an aryl group substituted with a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an amino group, an acyl group having 1 to 12 carbon atoms, a formyl group, a hydroxyl group or a carboxyl group; an aryloxy group, aryloxycarbonyl group, arylcarbonyl group or arylcarbonyloxy group.

Benzene derivative of the formula:

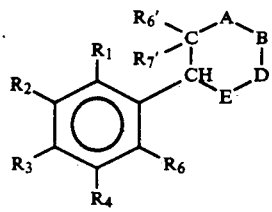

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbon atoms, an aralkyl group having 7 to 20 carbon atoms, an alkoxycarbonyl group having 1 to 12 carbon atoms, an aryl group, an aryloxy group, an acyl group having 1 to 12 carbon atoms or carboxyl group; $R_6'$ and $R_7'$ are independently a hydrogen atom, a halogen atom, an alkyl group having 1 to 6 carbon atoms or an aralkyl group having 7 to 20 carbon atoms; and A, B, D and E are independently —CO—, —O—, —S—,

($R_8$ and $R_9$ are independently a hydrogen atom, a halogen atom or an alkyl group having 1 to 6 carbon atoms) or

($R_{10}$ is a hydrogen atom, an alkyl group having 1 to 6 carbon atoms or an acyl group having 1 to 6 carbon atoms).

In the above-mentioned formulae [I] and [II], the term "aryl group" includes a phenyl group, a p-chlorophenyl grup, a p-bromophenyl group, a p-methoxyphenyl group, a p-tolylphenyl group, a p-cyanophenyl group, etc., the term "aryloxy group" includes a phenoxy group, a p-chlorophenoxy group, a p-bromophenoxy group, a p-methylphenoxy group, a p-cyanophenoxy group, etc., the term "aryloxycarbonyl group" includes a phenoxycarbonyl group, etc.; the term "arylcarbonyloxy group" includes a benzoyloxy group, a p-chlorobenzoyloxy group, etc.; and the term "arylcarbonyl group" includes a benzoyl group, a p-chlorobenzoyl group, etc.

More concretely, the benzene derivative of the formula [I] can include a diphenylmethane compound of the formula:

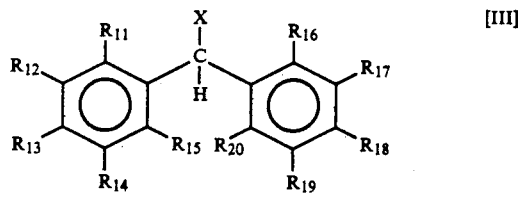

wherein $R_{11}$ through $R_{20}$ are independently a hydrogen atom, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an amino group, an acyl group having 1 to 12 carbon atoms, a formyl group, a hydroxy group or a carboxyl group; and X is a hydrogen atom, a halogen atom, an alkyl group having 1 to 12 carbon atoms, an alkoxy group having 1 to 12 carbon atoms, an acyl group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl group, an arylcarbonyl group or an arylcarbonyloxy group.

Examples of the benzene derivative represented by formula [I] include phenylcyclohexane, 4'-bromophenylcyclohexane, (p-anisyl)-cyclohexane, 4-phenylcyclohexanone, 2-phenylcyclohexanone, 3-phenylcyclohexanone, 4-phenylpiperidine, 2-phenylpiperidine, 3-phenylpiperidine, N-acetyl-4-phenylpiperidine, N-acetyl-2-phenylpiperidine, N-acetyl-3-phenylpiperidine, 4-phenyltetrahydropyrane, 2-phenyltetrahydropyrane, 3-phenyltetrahydropyrane, 4-(p-bromophenyl)-tetrahydropyrane, 2-(p-bromophenyl)-tetrahydropyrane, 3-(p-bromo-phenyl)-tetrahydropyrane, 4-(p-anisyl)-tetrahydropyrane, 3-(p-anisyl)-tetrahydropyrane, 2-(p-anisyl)-tetrahydropyrane, 4-cyclohexylbenzoic acid, ethyl 4-cyclohexylbenzoate, butyl 4-cyclohexylbenzoate, 4-cyclohexylacetophenone, 3-cyclohexylacetophenone, 2-cyclohexylacetophenone, 4-phenyltetrahydrothiopyrane, 2-phenyltetrahydrothiopyrane, 3-phenyltetrahydrothiopyrane, 6-phenyl-1,3-dioxane, 5-phenyl-1,3-dioxane, 6-phenyl-1,4-dioxane, 2-ph-enylglutaric anhydride, γ-phenyl-δ-valerolactone, α-phenyl-δ-valerolactone, β-phenyl-δ-valerolactone, α-phenyl-δ-valerolactam, β-phenyl-δ-valerolactam, γ-phenyl-δ-valerolactam, 2-phenylmorpholine, 2-phenyl-1,4-oxathiane and the like.

These benzene derivatives may be used either alone or in combination of two or more.

Examples of the benzene derivative represented by formula [II]include p-isopropylbenzoic acid, phenyl p-isopropylbenzoate, ethyl p-isopropylbenzoate, n-decyl p-isopropylbenzoate, p-isopropylanilyl, p-isopropyl-n-butoxybenzene, p-isopropylbromobenzene, p-diisopropylbenzene, m-diisopropylbenzene, α-phenylbutyric acid, ethyl α-phenylbutyrate, phenyl α-phenylbutyrate, α-phenylpropionic acid, phenyl α-phenylpropionate, n-decyl α-phenylpropionate, α-(p-bromophenyl)-butyric acid, α-(p-chlorophenyl)-butyric acid, dibutyl 3-isopropylphthalate, α-phenyllauric acid, p-isopropylbiphenyl, p-isopropylphenoxybenzene, p-isopropylacetophenone, p-isopropylpropiophenone, 1-phenyl-n-butanol, 1-phenyl-n-octanol, (1-phenyl)-n- butyl phenyl ether, 1-phenylethyl propyl ketone, α-phenyloctanal, α-phenylhexanal, 1-phenyloctyl acetate, 1,1-diphenylbutane, 1-benzoyl-1-phenylbutane, 1-phenyloctyl benzoate, and the like.

These benzene derivatives may be used either alone or in combination of two or more.

Examples of the diphenylmethane compound of the formula [III] include bromodiphenylmethane, chlorodiphenylmethane, 1,1-diphenylethane, 1,1-diphenylpropane, 1,1-diphenyl-n-butane, benzhydrol, methoxydiphenylmethane, diphenyl acetic acid, 3,3-diphenylpropionic acid, 4,4-diphenylbutyric acid, benzhydrylamine, di(p-chloro)phenylacetic acid, 2-p-chlorophenyl-2-phenyl acetic acid, methyl diphenylacetate, ethyl diphenylacetate, di(p-methyl)phenylacetic acid, 2-o-methoxyphenyl-2-phenylacetic acid, 2,2-diphenylacetaldehyde, 3,3-diphenylbutylaldehyde, etc.

These diphenylmethane compounds can be used alone or as a mixture thereof.

In the present invention, it is preferable to use the photoinitiator (b) in an amount of 0.01 to 20 parts by weight and the benzene derivative represented by formula [I] and/or [II] in an amount of 0.01 to 20 parts by weight, both per 100 parts by weight of the addition-polymerizable compound (a) having a boiling of point of 100° C. or higher at ordinary pressure.

If desired, the photopolymerizable composition of the invention may contain at least one high molecular weight organic polymer(s). As said high molecular weight organic polymer, thermoplastic high molecular weight organic polymers having a molecular weight of 10,000 to 700,000 are preferred. Its examples include the followings:

(A) Copolyesters

Copolyesters prepared from polyhydric alcohol such as diethylene glycol, triethylene glycol, tetraethylene glycol, trimethylolpropane, neopentyl glycol and the like and polybasic carboxylic acid such as terephthalic acid, isophthalic acid, sebacic acid, adipic acid and the like.

(B) Vinyl polymers

Homopolymers and copolymers of vinyl monomers such as acrylic acid, methacrylic acid, alkyl acrylates and alkyl methacrylates (e.g. methyl (meth)acrylate, ethyl (meth)acrylate, butyl (meth)acrylate and β-hydroxyethyl (meth)acrylate), styrene, vinyltoluene, vinyl chloride, vinyl butyral and the like.

(C) Polyformaldehydes (D) Polyurethanes (E) Polycarbonates (F) Nylons and polyamides (G) Cellulose esters such as methyl cellulose and ethyl cellulose By adding a high molecular weight organic polymer to the photopolymerizable composition, the properties of the composition such as adhesion to substrate, chemical resistance, film-formability and the like can be improved. Said high molecular weight organic polymer is used in an amount not exceeding 80% by weight, based on the summed weight of said high molecular weight organic polymer and said addition-polymerizable compound. If its amount exceeds 80% by weight, photocuring reaction cannot progress sufficiently.

If desired, the photopolymerizable composition of the invention may contain a colorant such as dye and pigment. As said colorant, well known ones such as Fuchsine, Crystal Violet, Methyl Orange, Nile Blue 2B, Victoria Pure Blue, Malachite Green, Night Green B, Spiron Blue and the like can be used.

The photopolymerizable composition of the invention may contain a radical polymerization inhibitor or a radical polymerization retarder for the purpose of enhancing its stability in storage. As said inhibitor and retarder, p-methoxyphenol, hydroquinone, pyrogallol, naphthylamine, phenothiazine, pyridine, nitrobenzene, aryl phosphite and the like can be referred to.

The photopolymerizable composition of the invention may contain other additives of which use in photopolymerizable compositions is well known, such as plasticizer, adhesion accelerator and the like.

The photopolymerizable composition of the invention is usable as a photoresist which is to be coated and dried on a support and thereafter exposed to active rays for production of printing plate or to be etched or plated for formation of a circuit. As the active ray source, those emitting an active ray having a wavelength of 250 to 550 nm are used.

Examples of such ray source include carbon arc lamp, mercury lamp, xenon arc lamp, argon glow lamp, argon ion laser and the like. Supports usable for this purpose include organic polymer films such as polyethylene film, polypropylene film, polyethylene terephthalate film and the like, metallic plates such as copper plate, aluminum plate, iron plate and the like, and insulating boards prepared by lining copper foil on a substrate such as glass epoxy substrate, paper epoxy substrate, paper-phenol substrate and the like.

It is considered that, in the present invention, component (b) polymerizes component (a) by the action of light and, at this time, component (c) controls the degree of polymerization and relaxes the contraction stress of polymerization so that strength of the resulting cured film is improved.

The photopolymerizable composition of the present invention is a photopolymerizable composition giving a cured film having a high strength. It is useful for the formation of dry film resist excellent in tenting property in the manufacture of printed circuit boards, for example.

Next, examples of the invention will be presented, wherein all the "parts" and "%" are by weight unless otherwise referred to.

EXAMPLES 1–7 AND COMAPRATIVE EXAMPLE 1

Preparation of Photopolymerizable Composition

| | |
|---|---|
| 40% solution of acryl polymer (methacrylic acid/methyl methacrylate/butyl methacrylate/2-ethylhexyl acrylate = 23/51/6/20 (by weight) copolymer; weight average molecular weight ca. 90,000) in ethyl Cellosolve | 120 parts |
| BPE-500 (trade name, manufactured by Shin'nakamura Kagaku K. K., a mixture of 2,2-bis(4-methacryloxypolyethoxyphenyl)-propanes) | 25 parts |
| MECHPP (trade name, manufactured by Osaka Yuki Kagaku K. K., γ-chloro-β-hydroxypropyl-β'-methacryloyloxyethyl o-phthalate) | 8.5 parts |
| Tetraethylene glycol dimethacrylate | 2.5 parts |
| Hydroquinone | 0.04 part |
| Benzophenone | 3.8 parts |
| 4,4'-Bis(diethylamino)-benzophenone | 0.17 part |
| Methyl ethyl ketone | 20 parts |

Coating solutions were prepared by adding each of the compounds shown in Table 1 to a photopolymerizable composition of the above-mentioned formulation. Apart from them, a comparative coating solution was prepared by adding none of the compounds of Table 1 to the same composition as above.

Each of the coating solutions thus obtained was coated on a polyethylene terephthalate film (trade name "Lumilar", manufactured by Toray Industries, Inc.) having a thickness of 25 μm by the use of a bar coater and dried at 100° C. for about 3 minutes in a hot air countercurrent type oven to obtain a photopolymerizable element. The dry photopolymerizable composition layer thus obtained had a thickness of 40 μm.

Next, the photopolymerizable element was laminated on both sides of a double-sided copper-clad glass epoxy board having clear surfaces and having through-holes (3.2 mm in diameter) by means of a laminater, i.e. an apparatus for laminating a material by the pressure and heat of rubber roll, at a rubber roll temperature of 160° C., so that the photopolymerizable composition layer came into contact with the copper surfaces.

The whole areas of both sides of the laminated sample thus obtained were exposed to the light of 3 KW superhigh pressure mercury lamp (HMW 201B, manufactured by ORC Seisakusho, Ltd.). After removing the polyethylene terephthalate film, the remainder was subjected to spray development at 30° C. with 1% aqueous solution of sodium carbonate for a period of 60 seconds, after which it was air-dried in the dark at room temperature for one hour. The center of cured film on the through-hole of this sample was pierced with a steel rod having a diameter of 2.0 mm by the use of rheometer (NRM-2010J-CW, manufactured by FUDOH Co.). The force (gf) required for breaking the film was read out, and it was taken as tenting strength. The results are shown in Table 1.

Table 1 demonstrates that the composition of the present invention give cured films having a high strength.

TABLE 1

| Example No. | Compound | Amount (parts by wt.) | Quantity of irradiation at 35 nm (mJ/cm²) | Tenting strength (gf) |
|---|---|---|---|---|
| Comparative Example 1 | None | — | 50 | 232 |
| | | | 100 | 341 |
| Example 1 | 4-Phenylcyclohexanone | 2.0 | 50 | 474 |
| | | 2.0 | 100 | 482 |
| Example 2 | 4-Phenylcyclohexane | 4.0 | 50 | 388 |
| | | 4.0 | 100 | 392 |
| Example 3 | 6-Phenyl-1,3-dioxane | 2.0 | 50 | 456 |
| | | 2.0 | 100 | 468 |
| Example 4 | 6-Phenyl-1,3-dioxane | 4.0 | 50 | 487 |
| | | 4.0 | 100 | 468 |
| Example 5 | 4-Phenylpiperidine | 4.0 | 100 | 494 |
| Example 6 | 2-Phenylcyclohexanone | 4.0 | 100 | 572 |
| Example 7 | 2-Phenylglutaric anhydride | 4.0 | 100 | 570 |

EXAMPLES 8–20 AND COMPARATIVE EXAMPLES 2–5

Preparation of Photopolymerizable Composition

| | |
|---|---|
| 40% solution of acryl polymer (a methacrylic acid/methyl methacrylate/butyl methacrylate/2-ethylhexyl acrylate = 23/51/6/20 (by weight) copolymer, weight average molecular weight ca. 90,000) in ethyl Cellosolve | 120 parts |
| BPE-500 (trade name, manufactured by Shin'nakamura Kagaku, K. K., a mixture of 2,2-bis(4-methacryloxypolyethoxyphenyl)-propanes) | 25 parts |
| MECHPP (trade name, manufactured by Osaka Yuki Kagaku K. K., chloro-β-hydroxypropyl-β'-methacryloyloxyethyl o-phthalate) | 8.5 parts |
| Tetraethylene glycol dimethacrylate | 2.5 parts |
| Hydroquinone | 0.04 part |
| Benzophenone | 3.8 parts |
| 4,4'-Bis(diethylamino)-benzophenone | 0.17 part |
| Methyl ethyl ketone | 20 parts |

Coating solutions were prepared by adding each of the compounds shown in Table 2 to a photopolymerizable composition of the above-mentioned formulation. Apart from them, a comparative coating solution was prepared by adding none of the compounds of Table 2 to the same composition as above.

Each of the coating solutions thus obtained was coated on a polyethylene terephthalate film (trade name "Lumilar", mfd. by Toray Industries, Inc.) having a thickness of 25 μm by the use of bar coater and dried at 100° C. for about 3 minutes in a hot air countercurrent type oven to obtain a photopolymerizable element. The dry photopolymerizable composition layer thus obtained had a thickness of 40 μm.

Next, the photopolymerizable element was laminated on both sides of a two-sided copper-lined glass epoxy board having clear surfaces and having throughholes (3.2 mm in diameter) by means of a laminater, i.e. an apparatus for laminating a material by the pressure and heat of rubber roll, at a rubber roll temperature of 160° C., so that the photopolymerizable composition layer came into contact with the copper surface.

The whole areas of both sides of the laminated sample thus obtained were exposed to the light of 3 KW superhigh pressure mercury lamp (HMW 201B, manufactured by ORC Seisakusho, Ltd.). After removing the polyethylene terephthalate film, the remainder was subjected to spray development at 30° C. with 1% aqueous solution of sodium carbonate for a period of 60 seconds, after which it was air-dried in the dark at room temperature for one hour. The center of cured film on the through-hole of this sample was pierced with a steel rod having a diameter of 2.0 mm by the use of rheometer (NRM-2010J-CW, manufactured by FUDOH Co.). The force (gf) required for breaking the film was read out, and it was taken as tenting strength. The results are shown in Table 2.

Table 2 demonstrates that the compositions of the present invention give cured films having a high strength.

TABLE 2

| Example No. | Compound | Amount (part by wt.) | Quantity of irradiation at 365 nm (mJ/cm$^2$) | Tenting strength (gf) |
|---|---|---|---|---|
| Comparative Example 2 | None | — | 50 | 232 |
| | | | 100 | 341 |
| Example 8 | α-Phenylbutyric acid | 2.0 | 50 | 428 |
| | | 2.0 | 100 | 448 |
| Example 9 | α-Phenylbutyric acid | 4.0 | 50 | 426 |
| | | 4.0 | 100 | 425 |
| Example 10 | p-Isopropylbenzyl alcohol | 2.0 | 100 | 450 |
| Example 11 | p-Isopropylphenyl benzyl ether | 2.0 | 100 | 440 |
| Example 12 | 2-Isopropyl-5-methylphenyl benzyl ether | 2.0 | 100 | 401 |
| Example 13 | 4-Isopropyl-3-methylphenyl benzyl ether | 2.0 | 100 | 435 |
| Example 14 | 3-Phenylpentane-2,4-dione | 2.0 | 100 | 437 |
| Example 15 | Cyclohexylphenylacetic acid | 2.0 | 100 | 519 |
| Example 16 | Cyclopentylphenylacetic acid | 2.0 | 100 | 461 |
| Example 17 | 3-Phenyl-1-butanol | 2.0 | 100 | 398 |
| Example 18 | 2-Phenylpropylisobutyric acid | 2.0 | 100 | 461 |
| Example 19 | 2-Phenylpropylbutyric acid | 2.0 | 100 | 489 |
| Example 20 | p-Isopropylbenzoic acid | 2.0 | 100 | 480 |
| Comparative Example 3 | p-t-Butylbenzoic acid | 2.0 | 100 | 320 |
| Comparative Example 4 | p-n-Butylbenzoic acid | 2.0 | 100 | 335 |
| Comparative Example 5 | p-t-Butylbenzyl alcohol | 2.0 | 100 | 321 |

EXAMPLES 21–26 AND COMPARATIVE EXAMPLES 6 and 7

Preparation of Photopolymerizable Composition

| | |
|---|---|
| 40% solution of acrylic polymer (a copolymer of methacrylic acid/methyl methacrylate/butyl methacrylate/2-ethylhexyl acrylate = 23/51/6/20 (in weight ratio) having a weight-average mol. wt. of about 90,000) in ethyl Cellosolve | 120 parts |
| BPE-500 (a trade name, mfd. by Shin'nakamura Kagaku K. K., a mixture of 2,2-bis(4-methacryloxypolyethoxyphenyl)-propanes) | 30 parts |
| MECHPP (a trade name, mfd. by Osaka Yuki Kagaku K. K., γ-chloro-β-hydroxypropyl-β'-methacyloyloxyethyl-o-phthalate) | 10 parts |
| Tetraethylene glycol dimethacrylate | 3 parts |
| Ante-di-W-500 (a trade name, mfd. by Kawaguchi Kagaku K. K., 2,2'-methylenebis-(4-ethyl-6-t-butylphenol)) | 0.3 part |
| N-(p-chhorophenyl)-N-ethylglycine | 4.0 parts |
| 3,3'-Carbonylbis(7-diethylamino)coumarin | 0.2 part |
| Methyl ethyl ketone | 20 parts |

Coating solutions were prepared by adding each of the compounds shown in Table 3 (Examples 21–26) and not adding any compound or a compound other than the formula [III] (Comparative Examples 6 and 7) to the photopolymerizable composition of the above-mentioned formulation. Each of the coating solutions was coated on a polyethylene terephthalate film (Lumilar, a trade name, mfd. by Toray Industries, Inc.) having a thickness of 25 μm by the use of a bar coater and dried at 100° C. for about 3 minutes in a hot air countercurrent type oven to obtain a photopolymerizable element. The dry photopolymerizable composition layer thus obtained had a thickness of 40 μm.

Next, the photopolymerizable element was laminated on both sides of a double-sided copper-clad glass epoxy board having clear surfaces and having through-holes (3.2 mm in diameter) by means of a laminater, i.e. an apparatus for laminating a meterial by the pressure and heat of rubber roll, at a rubber roll temperature of 160° C., so that the photopolymerizable composition layer came into contact with the copper surfaces. Whole areas of both sides of the laminated sample were exposed to a light from a 3 KW ultrahigh pressure mercury lamp (HMW 201B mfd. by ORC Seisakusho, Ltd.). The exposure to light was conducted by contacting the sample with a step tablet (Gray-Scale, a trade name, mfd. by Dainippon Screen Manufacturing Co., Ltd., optical density differences 0.15, minimum optical density 0.05, maximum optical density 3.05, 21 steps, a film) with an energy so as to retain 8 steps when developed. After removing the polyethylene terephthalate film, the remainder was subjected to spray development at 30° C. with a 1% aqueous solution of sodium carbonate for 50 seconds, followed by air-drying in the drak at room temperature for one hour. The center of cured film on a through-hole of this sample was pierced with a steel rod having a diameter of 2.0 mm by the use of a rheometer (NRM-201J-CW, mfd. by FUDOH Co.). The force (gf) required for breaking the film was read out and it was taken as tenting strength. The results are shown in Table 3.

TABLE 3

| Example No. | Compound *1 | Tenting strength (gf) |
|---|---|---|
| Comparative Example 6 | None | 345 |
| Comparative Example 7 | 2,2-Diphenylpropionic acid | 332 |
| Example 21 | Diphenylacetic acid | 543 |
| Example 22 | Bromodiphenylmethane | 417 |
| Example 23 | Fluorodiphenylmethane | 450 |
| Example 24 | Benzhydrol | 454 |
| Example 25 | Benzhydrylamine | 454 |
| Example 26 | 3,3-Diphenylpropionic acid | 500 |

Note
*1: The compound was added in an amount of 5 mmole per 100 parts of the acrylic polymer, BPE-500, MECHPP and tetraethylene glycol dimethacrylate.

As shown in Table 3, when the special diphenylmethane compounds of the formula [III] are used, high strength of cured films can be obtained.

What is claimed is:

1. A photopolymerizable composition comprising:
   (a) at least one addition-polymerizable compound having a boiling point of 100° C. or higher at atmospheric pressure,
   (b) a photoinitiator,
   (c) a benzene derivative represented by the formula

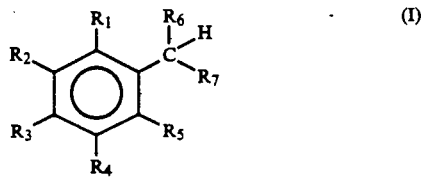

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbona toms, an alkoxycarbonyl group having 1 to 12 carbon atoms, an aryl group, an aryloxy group, an acyl group having 1 to 12 carbon atoms, a formyul group, or a carboxyl group; $R_6$ is a hydrogen atom, a halogen atom, an alkyl group having 1 to 12 carbon atoms, an alkoxy group having 1 to 12 carbon atoms, an acyl group having 1 to 12 carbon atoms, a carboxyl group, a hydroxyl group, an amino grup, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl group, an arylcarbonyl group or an arylcarbonyloxy group; and $R_7$ is an alkyl group having 1 to 12 carbon atoms, a hydroxyl group, a formyl group, a carboxyl group, an alkoxycarbonyl group having 1 to 12 carbon atoms, an alkoxy group having1 to 12 carbon atoms, an acyl group having 1 to 12 carbon atoms, an alkylcarbonyloxy group having 1 to 12 carbon atoms, an aryl group, an aryl group substituted with a halogen atom, an aryloxy group, an amino grup, aryloxycarbonyl group, arylcarbonyl group or arylcarbonyloxy group, and/or a benzene derivative represented by the formula:

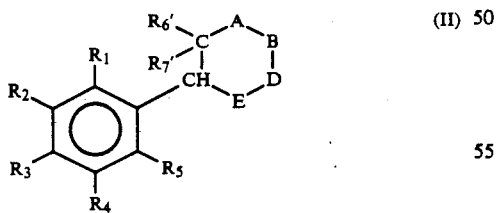

wherein $R_1$, $R_2$, $R_3$, $R_4$ and $R_5$ are independently a hydrogen atom, a halogen atom, an alkyl group having 1 to 12 carbon atoms, an alkoxy group having 1 to 12 carbon atoms, an aralkyl group having 7 to 20 carbon atoms, an alkoxycarbonyl group having 1 to 12 carbon atoms, an aryl group, an aryloxy group, an acyl group having 1 to 12 carbon groups or carboxyl group; $R_6'$ and $R_7'$ are independently a hydrogen atom, a halogen atom, an alkyl group having 1 to 6 carbon atoms, or a aralkyl group having 7 to 20 carbon atoms; and A, B, D and E are independently —CO—, —O—, —S—,

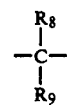

($R_8$ and $R_9$ are independently a hydrogen atom, a halogen atom or an alkyl group having 1 to 6 carbon atoms) or

($R_{10}$ is a hydrogen atom, an alkyl group having 1 to 6 carbon atoms or an acyl group having 1 to 6 carbon atoms) and
   (d) a high molecular weight organic present in an amount not exceeding 80% by weight based on the total weight of said high molecular weight organic polymer and said at least one addition-polymerizable compound.

2. A composition according to claim 1, wherein the component (c) is a benzene derivative of formula (I).

3. A composition according to claim 1, wherein the component (c) is a benzene derivative of formula (II).

4. A photopolymerizable composition comprising:
   (a) at least one addition-polymerizable compound having a boiling point of 100° C. or higher at atmospheric pressure,
   (b) a photoinitiator,
   (c) a diphenylmethane compound of the formula:

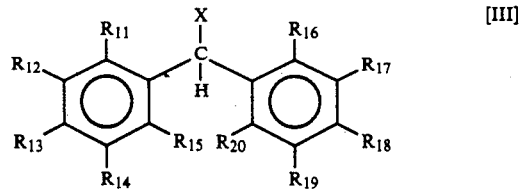

wherein $R_{11}$ through $R_{20}$ are independently a hydrogen atom, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an acyl group having 1 to 12 carbon atoms, a formyl group, or a carboxyl group; and X is a hydrogen atom, a halogen atom, an alkyl group having 1 to 12 carbon atoms, an alkoxy group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl grup, an arylcarbonyl group or an arylcarbonyloxy group, and
   (d) a high molecular weight organic polymer in an amount not exceeding 80% by weight based on the total weight of said high molecular weight organic polymer and the addition-polymerizable compound.

5. A composition according to claim 4 wherein the high molecular weight organic polymer is a vinyl polymer.

6. A composition according to claim 1, wherien the at least one addition-polymerizable compound is at least one member selected fro mthe group consisting of γ-chloro-β-hydroxypropyl-β'-methacryloyloxy-ethyl-o-phthalate, a mixture of 2,2-bis(4-methacryloxypolyethoxyphenyl)-propanes, trimethylolpropane triacrylate, trimethylolpropane trimethacrylate, pentaerythritol tetraacrylate, pentaerythritol tetramethacrylate, tetraethylene glycol diacrylate, and tetraethylene glycol dimethacrylate.

7. A photopolymerizable composition comprising:
   (a) at least one addition-polymerizable compound comprising a mixture of 2,2-bis(4-methacryloxypolyethoxyphenyl)propanes and γ-chloro-β-hydroxypropyl-β'-methacryloyloxyethyl-o-phthalate;
   (b) a photoinitiator comprising a combination of N-(p-chloropehnyl)-N-ethylglycine and 3,3'-carbonylbis(7-diethylamino)coumarin;
   (c) a benzene derivative comprising diphenylacetic acid; and
   (d) a high molecular weight organic polymer present in an amount not exceeding 80% by weight based on the total weight of said high molecular weight organic polymer and said at least one addition-polymerizable compound, said high molecular weight organic polymer comprising a copolymer of methacrylic acid/methyl methacrylate/butyl methacrylate/2-ethylhexyl acrylate.

8. A photopolymerizable composition comprising:
   (a) at least one addition-polymerizable compound having a boiling point of 100° C. or higher at atmospheric pressure;
   (b) a combination of a 3-ketocoumarin and a N-phenylglycine as a photoinitiator;
   (c) a benzene derivative that is a diphenylmethane compound of the formula (III)

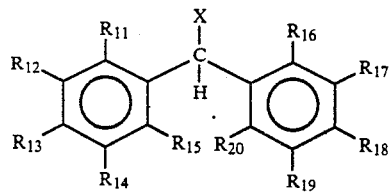

wherein $R_{11}$ through $R_{20}$ are independently a hydrogen atom, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an acyl group having 1 to 12 carbon atoms, a formyl group, or a carboxyl group; and X is a hydrogen atom, a halogen atom, an alkyl group having 1 to 12 carbon atoms, an acyl group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl gruop, an arylcarbonyl group or an arylcarbonyloxy group and
   (d) a high molecular weight organic polymer that is a vinyl polymer.

9. A photopolymerizable composition comprising:
   (a) at least one addition-polymerizable compound comprising a mixture of 2,2-bis(b 4-methacryloxypolyethoxyphenyl)propane;
   (b) a photoinitiator comprising a combination of N-(p-chlorophenyl)-N-ethylglycine and 2,6-bis(p-N,N-diethyl-aminobenzylidene)-4-methyl-4-azacyclohexanone;
   (c) a benzene derivative comprising diphenylacetic acid; and
   (b) a high molecular weight organic polymer comprising a copolymer of methacrylic acid/methyl methacrylate/butyl methacrylate/2-ethylhexyl acrylate and in an amount not exceeding 80% by weight based on the total weight of said high molecular weight organic polymer and said at least one addition-polymerizable compound.

10. A photopolymerizable composition comprising:
    (a) at least one addition-polymerizable compound having a boiling point of 100° C. or higher at atmospheric pressure;
    (b) a photoinitiator that is a combination of N-(p-chlorphenyl)-N-ethylglycine and 2,6-bis(p-N,N-diethylaminobenzylidene)-4-methyl-4-azacyclohexanone;
    (c) a benzene derivative that is a diphenylmethane compound of the formula (III)

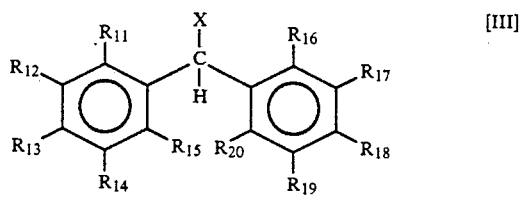

wherein $R_{11}$ through $R_{20}$ are independently a hydrogen atoms, a halogen atom, an alkyl group having 1 to 12 carbon atoms, an alkoxy group having 1 to 12 carbon atoms, an alkoxycarbonyl group having 1 to 12 carbon atoms, an aryl group, an aryloxy group, an acyl group having 1 to 12 carbon atoms, a formyl group, or a carboxyl grup, and X is a hydrogen atom, a halogen atom, an alkyl group having 1 to 12 carbon atoms, an acyl group having 1 to 12 carbon atoms, a carboxyl group, a hydroxyl group, an amino group, an alkylamino group having 1 to 12 carbon atoms, a formyl group, an alkoxycarbonyl group having 1 to 12 carbon atoms, an alkoxy group having 1 to 12 carbon atoms, an alkoxycarbonyloxy group having 1 to 12 carbon atoms, an aryl group, an aryloxycarbonyl gruop, an arylcarbonyl group or an arylcarbonyloxy group and
    (d) a high molecular weight organic polymer that is a vinyl polymer.

* * * * *